(12) United States Patent
Kim et al.

(10) Patent No.: US 8,004,060 B2
(45) Date of Patent: Aug. 23, 2011

(54) METAL GATE COMPATIBLE ELECTRICAL ANTIFUSE

(75) Inventors: Deok-kee Kim, Bedford Hills, NY (US); Chandrasekharan Kothandaraman, Hopewell Junction, NY (US); Dan Moy, Bethel, CT (US); Norman W. Robson, Hopewell Junction, NY (US); John M. Safran, Wappingers Falls, NY (US); Kenneth J. Stein, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 11/946,938

(22) Filed: Nov. 29, 2007

(65) Prior Publication Data

US 2009/0141533 A1 Jun. 4, 2009

(51) Int. Cl.
*H01L 29/00* (2006.01)
(52) U.S. Cl. .............................. 257/529; 257/E23.149
(58) Field of Classification Search .......... 257/529–543, 257/514–523, 50, 209, E23.147–E23.149, 257/E23.15
See application file for complete search history.

(56) References Cited

U.S. PATENT DOCUMENTS

| | | | | |
|---|---|---|---|---|
| 5,354,712 A * | 10/1994 | Ho et al. | | 438/643 |
| 5,466,484 A * | 11/1995 | Spraggins et al. | | 438/385 |
| 6,156,602 A * | 12/2000 | Shao et al. | | 438/238 |
| 6,436,738 B1 * | 8/2002 | Yu | | 438/132 |
| 6,767,795 B2 * | 7/2004 | Ahn et al. | | 438/287 |
| 7,217,981 B2 * | 5/2007 | Coolbaugh et al. | | 257/380 |
| 7,414,295 B2 * | 8/2008 | Cho et al. | | 257/529 |
| 2004/0113235 A1 * | 6/2004 | Coolbaugh et al. | | 257/532 |
| 2007/0007621 A1 * | 1/2007 | Omura et al. | | 257/529 |
| 2008/0116505 A1 * | 5/2008 | Wang | | 257/324 |

* cited by examiner

*Primary Examiner* — Matthew W Such
*Assistant Examiner* — Ali Naraghi
(74) *Attorney, Agent, or Firm* — Scully, Scott, Murphy & Presser, P.C.; H. Daniel Schnurmann

(57) ABSTRACT

A metal layer and a semiconductor layer are sequentially deposited on a substrate. The semiconductor layer and the metal layer are lithographically patterned to form a stack of a semiconductor portion and a metal gate portion, which is preferably performed concurrently with formation of at least one metal gate stack. In one embodiment, the size of the semiconductor portion is reduced and a metal semiconductor alloy portion is formed on the semiconductor portion by metallization. In a first electrical antifuse formed thereby, the metal semiconductor alloy portion may be electromigrated to form a short between the metal semiconductor alloy portion and the metal gate portion. In another embodiment, two disjoined metal semiconductor alloy portions are formed on the semiconductor portion. In a second electrical antifuse formed thereby, the metal semiconductor alloy portion may be electromigrated to form a short between the two previously disjoined metal semiconductor alloy portions.

8 Claims, 16 Drawing Sheets

METAL GATE COMPATIBLE ELECTRICAL ANTIFUSE

FIELD OF THE INVENTION

The present invention relates to semiconductor structures, and particularly to electrical antifuses that are compatible with another semiconductor structure having a metal gate electrode and methods of manufacturing the same.

BACKGROUND OF THE INVENTION

Electrical fuses and electrical antifuses are used in the semiconductor industry to implement array redundancy, field programmable arrays, analog component trimming circuits, and chip identification circuits. Once programmed, the programmed state of an electrical fuse or an electrical antifuse does not revert to the original state on its own, that is, the programmed state of the fuse is not reversible. For this reason, electrical fuses and electrical antifuses are called One-Time-Programmable (OTP) memory elements.

Programming or lack of programming constitutes one bit of stored information in fuses or antifuses. The difference between fuses and antifuses is the way the resistance of the memory element is changed during the programming process. Semiconductor fuses have a low initial resistance state that may be changed to a higher resistance state through programming, i.e., through electrical bias conditions applied to the fuse. In contrast, semiconductor antifuses have a high initial resistance state that may be changed to a low resistance state through programming.

Continuous advances in the semiconductor technology oftentimes require changes in the material employed in semiconductor structures. Of particular relevance is the advent of a metal gate electrode, which, in addition to the gate dielectric, a polysilicon layer, and a metal silicide layer, contains a metal gate layer in a gate stack. Typically, the metal gate layer is employed in conjunction with a high-k gate dielectric material. This is because high gate leakage current of nitrided silicon dioxide and depletion effect of polysilicon gate electrodes limits the performance of conventional silicon oxide based gate electrodes. High performance devices for an equivalent oxide thickness (EOT) less than 1 nm require a high-k gate dielectric material and a metal gate electrode to limit the gate leakage current and provide high on-currents.

The high-k gate dielectric materials refer to dielectric metal oxides or dielectric metal silicates having a dielectric constant that is greater than the dielectric constant of silicon oxide of 3.9 and capable of withstanding relatively high temperatures, e.g., above 600° C., and preferably above 800° C. The metal gate layer may comprise a metal, a metal alloy, or a metal nitride, and typically has an even higher conductivity than the metal silicide.

In view of the above, there exists a need for an electrical antifuse structure compatible with fabrication of other semiconductor devices employing metal gate electrodes and methods of manufacturing the same.

SUMMARY OF THE INVENTION

The present invention addresses the needs described above by providing electrical antifuses compatible with a high-k gate dielectric and a metal gate layer, and methods of manufacturing the same.

A high dielectric constant material layer, a metal gate layer, and a semiconductor layer are sequentially deposited on a substrate. The semiconductor layer and the metal gate layer are lithographically patterned to form a stack of a semiconductor portion and a metal gate portion, which is preferably performed concurrently with formation of at least one metal gate stack. In one embodiment, the size of the semiconductor portion is reduced and a metal semiconductor alloy portion is formed on the semiconductor portion by metallization. In a first electrical antifuse formed thereby, the metal semiconductor alloy portion may be electromigrated to form a short between the metal semiconductor alloy portion and the metal gate portion. In another embodiment, two disjoined metal semiconductor alloy portions are formed on the semiconductor portion. In a second electrical antifuse formed thereby, the metal semiconductor alloy portion may be electromigrated to form a short between the two previously disjoined metal semiconductor alloy portions.

According to an aspect of the present invention, a semiconductor structure is provided, which comprises:

a metal portion having a substantially planar top surface and located on a substrate;

a semiconductor portion vertically abutting a portion of the substantially planar top surface; and a metal semiconductor alloy portion vertically abutting a top surface of the semiconductor portion, wherein another portion of the substantially planar top surface vertically abuts an insulator layer.

In one embodiment, the semiconductor structure further comprises:

a first contact via vertically abutting the metal semiconductor alloy portion; and a second contact via vertically abutting the another portion of the substantially planar top surface.

In another embodiment, the semiconductor structure further comprises:

a first dielectric spacer portion laterally abutting the semiconductor portion and vertically abutting the another portion of the substantially planar top surface; and a second dielectric spacer portion laterally abutting the metal portion, disjoined from the semiconductor portion, and located beneath the substantially planar top surface.

In even another embodiment, the semiconductor structure further comprises a high dielectric constant material layer having a dielectric constant greater than 4.0 and vertically abutting the substrate and the metal portion.

In yet another embodiment, the high dielectric constant material layer comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from about 0.5 to about 3 and each value of y is independently from 0 to about 2.

In still another embodiment, the semiconductor portion comprises one of an undoped silicon containing semiconductor material and a doped silicon containing semiconductor material.

According to another aspect of the present invention, another semiconductor structure is provided, which comprises:

a metal portion located on a substrate;

a semiconductor portion vertically abutting the metal portion; and a first metal semiconductor alloy portion vertically abutting a first portion of a top surface of the semiconductor portion; and a second metal semiconductor alloy portion vertically abutting a second portion of the top surface of the semiconductor portion and disjoined from the first metal semiconductor alloy portion.

In one embodiment, the semiconductor structure further comprises:

a dielectric material portion laterally abutting a sidewall of the first metal semiconductor alloy portion and the second metal semiconductor alloy portion; and an insulator layer abutting the first metal semiconductor alloy portion, the second metal semiconductor alloy portion, and the dielectric material portion.

In another embodiment, the semiconductor structure further comprises:

a first contact via vertically abutting the first metal semiconductor alloy portion; and a second contact via vertically abutting the second metal semiconductor alloy portion.

In even another embodiment, the semiconductor structure further comprises a dielectric spacer laterally abutting and enclosing a stack of the metal portion and the semiconductor portion.

In yet another embodiment, the semiconductor structure further comprises a high dielectric constant material layer having a dielectric constant greater than 4.0 and vertically abutting the substrate and the metal portion.

In still another embodiment, the semiconductor structure further comprises the semiconductor portion comprises one of an undoped silicon containing semiconductor material and a doped silicon containing semiconductor material.

According to even another aspect of the present invention, a method of programming an electrical antifuse is provided, which comprises:

providing an electrical antifuse, a first contact via, and a second contact via on a substrate, wherein the first contact via and the second contact via directly contact the electrical antifuse; and passing current between the first contact via and the second contact via to electromigrate a metal semiconductor alloy material and to form an electrical short between the first contact via and the second contact via, wherein the electrical antifuse includes:

a metal portion having a substantially planar top surface;

a semiconductor portion vertically abutting the substantially planar top surface; and a metal semiconductor alloy portion vertically abutting a top surface of the semiconductor portion;

and wherein the first contact via vertically abuts the metal semiconductor alloy portion, and wherein the second contact via vertically abuts one of another metal semiconductor alloy portion or the substantially planar top surface of the metal portion, wherein the another metal semiconductor alloy portion vertically abuts the top surface of the semiconductor portion and is disjoined from the metal semiconductor alloy portion, and wherein the second contact via is disjoined from the semiconductor portion.

According to one embodiment, the method further comprises forming a high dielectric constant material layer having a dielectric constant greater than 4.0 directly on the substrate, wherein the metal portion is formed directly on the metal portion.

According to another embodiment, the method further comprises forming a dielectric spacer directly on the electrical antifuse, wherein the dielectric spacer comprises:

a first dielectric spacer portion laterally abutting the semiconductor portion and vertically abutting the substantially planar top surface; and a second dielectric spacer portion laterally abutting the metal portion, disjoined from the semiconductor portion, and located beneath the substantially planar top surface.

According to yet another embodiment, the method further comprises:

forming a dielectric material portion laterally abutting a sidewall of the metal semiconductor alloy portion and the another metal semiconductor alloy portion; and forming an insulator layer abutting the metal semiconductor alloy portion, the another metal semiconductor alloy portion, and the dielectric material portion.

According to yet another aspect of the present invention, a method of forming a semiconductor structure is provided, which comprises:

forming a stack of a metal portion and a semiconductor portion on a substrate, wherein the semiconductor portion is formed on top of the metal portion;

forming a metal semiconductor alloy portion on the semiconductor portion;

forming a first contact via on the metal semiconductor alloy portion; and forming a second contact via directly on one of another metal semiconductor alloy portion or the metal portion, wherein the another metal semiconductor alloy portion vertically abuts a top surface of the semiconductor portion and is disjoined from the metal semiconductor alloy portion, and wherein the second contact via is disjoined from the semiconductor portion.

In one embodiment, the method further comprises:

removing a fraction of the semiconductor portion prior to the forming of the metal semiconductor alloy portion; and forming a dielectric spacer on the metal portion and the semiconductor portion, wherein a first dielectric spacer portion of the dielectric spacer laterally abuts the semiconductor portion and vertically abuts a substantially planar top surface of the metal portion, and wherein a second dielectric spacer portion of the dielectric spacer laterally abuts the metal portion and is disjoined from the semiconductor portion.

In another embodiment, the method further comprises:

forming a dielectric material portion directly on a middle portion of the semiconductor portion, wherein a first end portion and a second end portion of the semiconductor portion are exposed, and wherein the metal semiconductor alloy portion is formed directly on the first end portion; and forming the another metal semiconductor alloy portion directly on the second end portion.

In yet another embodiment, the semiconductor portion comprises one of an undoped silicon containing semiconductor material and a doped silicon containing semiconductor material.

According to still another aspect of the present invention, another method of forming a semiconductor structure is provided, which comprises:

forming a stack of a metal portion and a semiconductor portion on a substrate, wherein the semiconductor portion is formed on top of the metal portion;

removing a fraction of the semiconductor portion and exposing a portion of a substantially planar top surface of the metal portion;

forming a metal semiconductor alloy portion directly on a top surface of the semiconductor portion; and forming a first contact via directly on the metal semiconductor alloy portion and a second contact via directly on the portion of the substantially planar top surface of the metal portion.

In one embodiment, the method further comprises forming a dielectric spacer on the metal portion and the semiconductor portion after the removing of the fraction of the semiconductor portion, wherein a first dielectric spacer portion of the dielectric spacer laterally abuts the semiconductor portion and vertically abuts the substantially planar top surface of the metal portion, and wherein a second dielectric spacer portion of the dielectric spacer laterally abuts the metal portion and is disjoined from the semiconductor portion.

In another embodiment, the method further comprises forming a high dielectric constant (high-k) material layer having a dielectric constant greater than 4.0 directly on the substrate, wherein the stack is formed directly on the high-k material layer.

In yet another embodiment, the semiconductor portion comprises one of an undoped silicon containing semiconductor material and a doped silicon containing semiconductor material.

According to still yet another aspect of the present invention, a yet another method of forming a semiconductor structure is provided, which comprises:

forming a stack of a metal portion and a semiconductor portion on a substrate, wherein the semiconductor portion is formed on top of the metal portion;

forming a dielectric material portion directly on a middle portion of the semiconductor portion, wherein a first end portion and a second end portion of the semiconductor portion are exposed;

forming a first metal semiconductor alloy portion directly on the first end portion and a second metal semiconductor alloy portion directly on the second end portion; and forming a first contact via directly on the first metal semiconductor alloy portion and a second contact via directly on the second metal semiconductor alloy portion.

In one embodiment, the method further comprises forming an insulator layer directly on the dielectric material portion, the first metal semiconductor alloy portion, and the second metal semiconductor alloy portion, wherein the insulator layer comprises a different material than the dielectric material portion.

In another embodiment, the method further comprises forming a high dielectric constant (high-k) material layer having a dielectric constant greater than 4.0 directly on the substrate, wherein the stack is formed directly on the high-k material layer.

In yet another embodiment, the semiconductor portion comprises one of an undoped silicon containing semiconductor material and a doped silicon containing semiconductor material.

DETAILED DESCRIPTION OF THE INVENTION

Figure 1A:
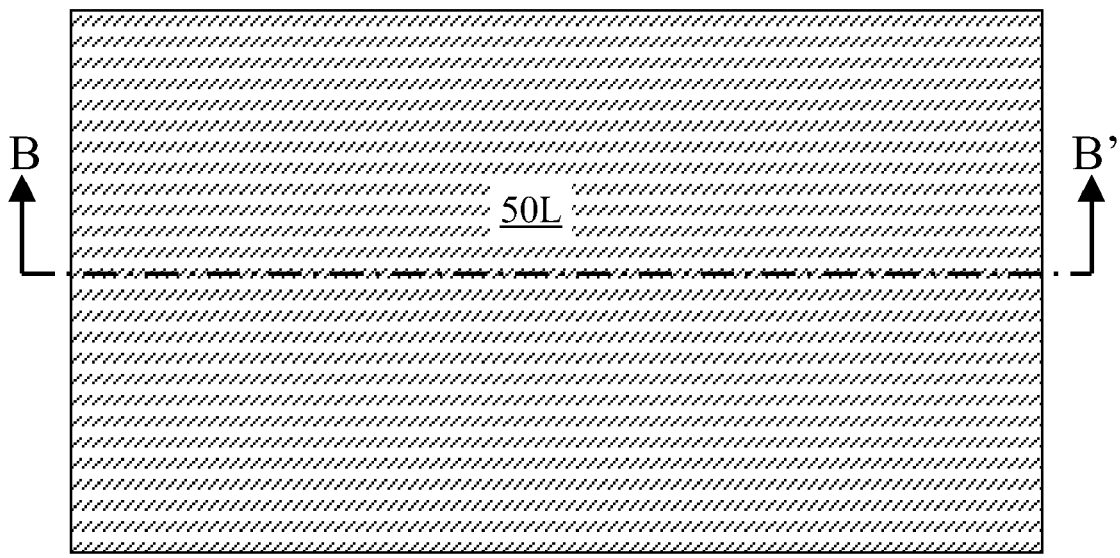
FIG. 1A-6B are sequential views of a first exemplary structure according to a first embodiment of the present invention during various stages of manufacturing. Figures with the same numeric label correspond to the same stage of manufacturing. Figures with the suffix "A" are top-down views, and figures with the suffix "B" are vertical cross-sectional views along the plane B-B' of the corresponding figure with the same numeric label and the suffix "A." Insulator layer 90 is omitted in FIG. 6A.

As stated above, the present invention relates to electrical antifuses that are compatible with another semiconductor structure having a metal gate electrode and methods of manufacturing the same, which are now described in detail with accompanying figures. It is noted that like and corresponding elements mentioned herein and illustrated in the drawings are referred to by like reference numerals.

Figure 1B:
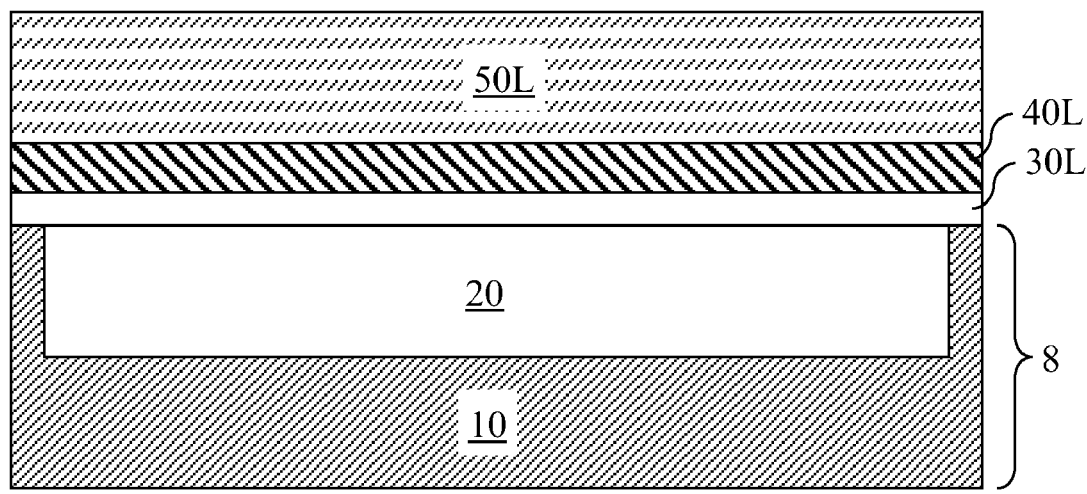

Referring to FIGS. 1A-1B, a first exemplary semiconductor structure according to the present invention is shown. FIG. 1A is a top-down view. FIG. 1B is a vertical cross-sectional view along the plane B-B' shown in FIG. 1A.

The first exemplary semiconductor structure comprises a semiconductor substrate 8 that contains a semiconductor layer 10 and a shallow trench isolation structure 20. The semiconductor substrate may be a bulk substrate, a semiconductor-on-insulator (SOI) substrate, or a hybrid substrate having a bulk portion and an SOI portion. The semiconductor layer 10 comprises a semiconductor material such as silicon, a silicon containing alloy, a germanium containing alloy, a III-V compound semiconductor, or a II-IV semiconductor. Preferably, the semiconductor layer 10 is single crystalline. The shallow trench isolation structure 20 comprises a dielectric material and provides electrical isolation between semiconductor devices formed on the semiconductor layer 10.

A stack of a high dielectric constant (high-k) material layer 30L and a metal layer 40L are formed on a top surface of the semiconductor substrate 8. The high dielectric constant material layer 30L comprises a high-k dielectric material, which comprises a dielectric metal oxide having a dielectric constant that is greater than the dielectric constant of silicon oxide of 3.9. The high-k dielectric material is also known as high-k gate dielectric material in the art. The dielectric metal oxide is a high-k material including a metal and oxygen, and optionally nitrogen. For example, the high-k dielectric material may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2

The high dielectric constant material layer 30L is formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. The thickness of the high dielectric constant material layer 30L may be from about 2 nm to about 6 nm, and may have an effective oxide thickness on the order of or less than 1 nm.

The metal layer 40L is formed directly on the high dielectric constant material layer 30L, for example, by chemical vapor deposition (CVD), physical vapor deposition (PVD), atomic layer deposition (ALD), etc. The metal layer 40L comprises a conductive metallic material which may be a metal, a metal alloy, or a metal nitride. For example, the metal layer 40L may comprise a material such as TaN, TiN, WN, TiAlN, TaCN, other conductive refractory metal nitrides, or an alloy thereof. The conductive metallic material is also known as metal gate material in the art. The thickness of the metal layer 40L may be from about 5 nm to about 40 nm, and preferably from about 7 nm to about 20 nm, although lesser and greater thicknesses are alos contemplated herein. The composition of the metal layer 40L may be selected to optimize performance of semiconductor devices such as a threshold voltage of a transistor employing a metal gate. Preferably, the metal layer 40L has a substantially planar top surface without topography.

A semiconductor layer 50L is then formed on the metal layer 40L. The semiconductor layer 50L has a polycrystalline, microcrystalline, or amorphous structure and comprises a semiconductor material such as silicon, a silicon containing alloy, a germanium containing alloy, a III-V compound semiconductor, or a II-IV semiconductor. Preferably, semiconductor layer 50L may be undoped, or may be doped with at least one electrical dopant such as boron, gallium, indium, phosphorus, arsenic, antimony, or a combination thereof. The semiconductor layer 50L may be formed by chemical vapor deposition (CVD) such as rapid thermal chemical vapor deposition (RTCVD), low pressure chemical vapor deposition (LPCVD), plasma enhanced chemical vapor deposition (PECVD). The semiconductor layer 50L may have a thickness from about 30 nm to about 300 nm, and preferably from about 50 nm to about 200 nm, and even more preferably from about 80 nm to about 150 nm.

Figure 2A:
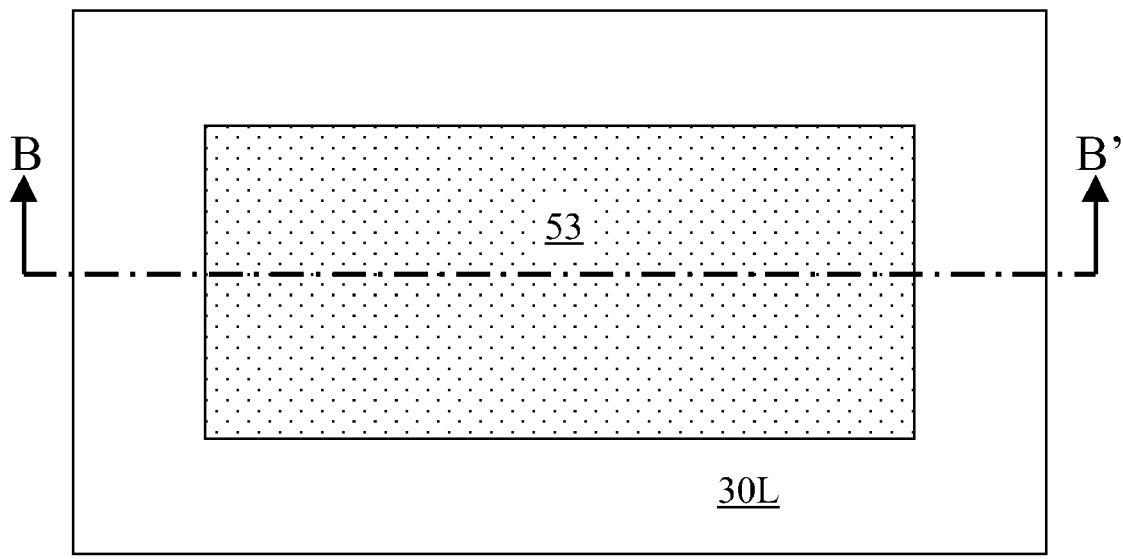
Figure 2B:
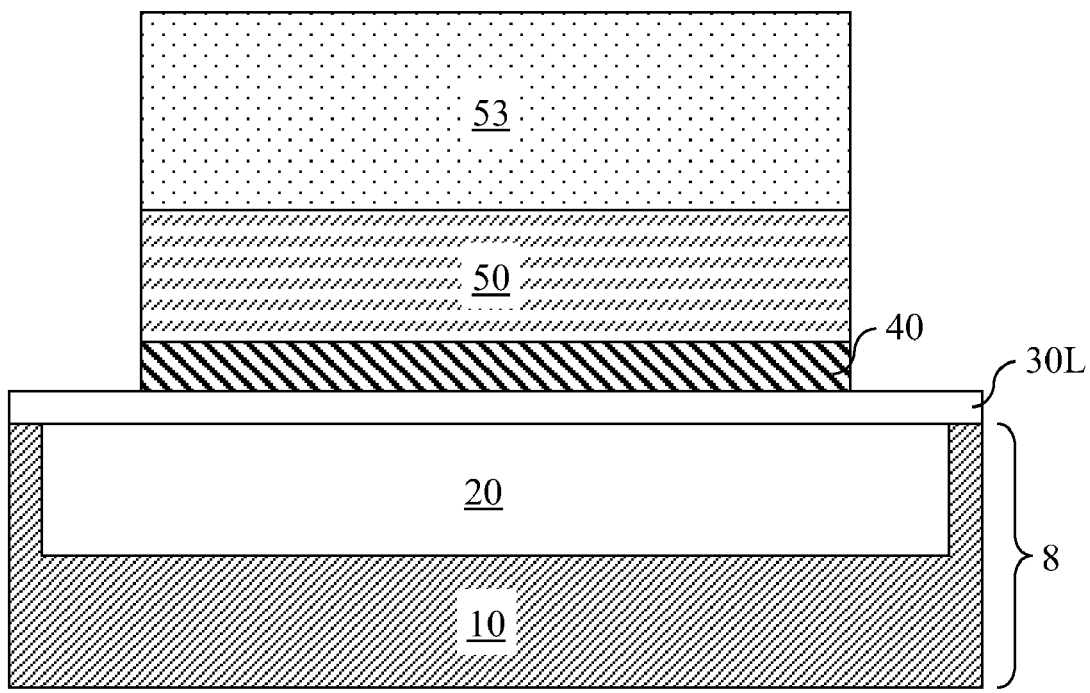

Referring to FIGS. 2A-2B, a first photoresist 53 is applied over the surface of the semiconductor layer 50L and lithographically patterned. The pattern in the first photoresist 53 is then transferred into the stack of the semiconductor layer 50L and the metal layer 40L by a reactive ion etch. The reactive ion etch may be selective to the high dielectric constant material layer 30L. The remaining portion of the metal layer 40L constitutes a metal portion 40, and the remaining portion of the semiconductor layer 50L constitutes a semiconductor portion 50.

A metal gate stack (not shown) may be concurrently formed directly on an exposed portion of the semiconductor layer 10 in another portion of the semiconductor substrate 8. The metal gate stack comprises another metal portion and another semiconductor portion formed directly thereupon. The portion of the high-k material layer 30L directly underneath the metal gate stack functions as a high-k gate dielectric. The metal gate stack functions as a gate electrode. Thus, the first exemplary semiconductor structure of the present invention is compatible with metal gate devices.

After the reactive ion etch, each of the semiconductor portion 50 and the metal portion 40 has sidewalls that are substantially vertically coincident with sidewalls of the first photoresist 53. Preferably, the entire set of sidewalls of each of the semiconductor portion 50 and the metal portion 40 overlie the shallow trench isolation structure 20 to provide thermal insulation of an inventive electrical antifuse structure to be subsequently formed.

Figure 3A:
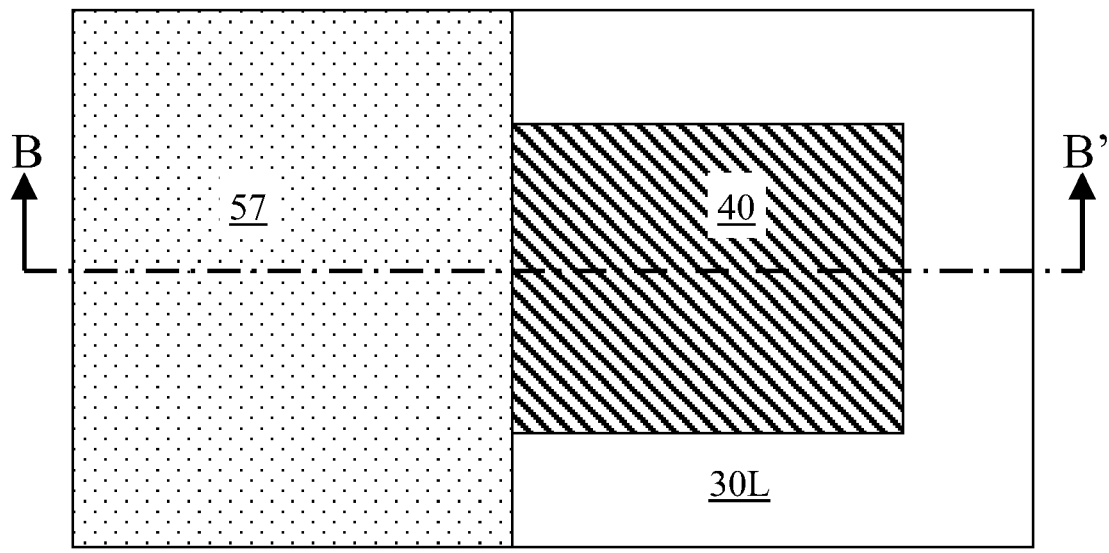
Figure 3B:
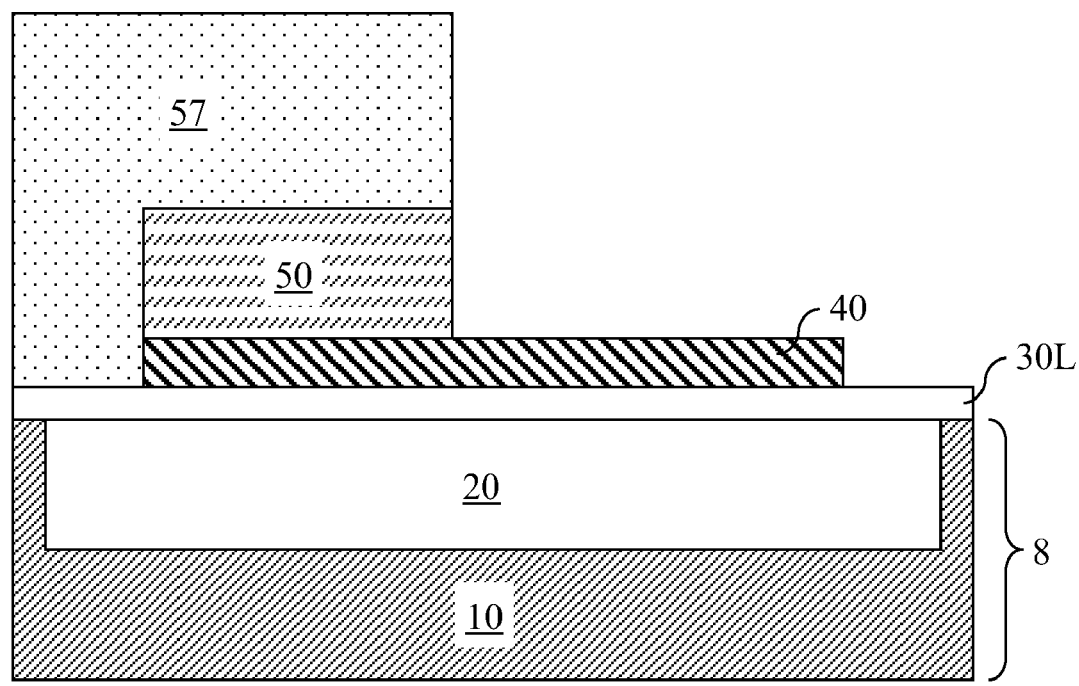

Referring to FIGS. 3A and 3B, a second photoresist 57 is applied and lithographically patterned to cover a portion of the semiconductor portion 50. An edge of the second photoresist 53 overlies a top surface of the semiconductor portion 50. An exposed portion of the semiconductor portion is removed by a reactive ion etch. The reactive ion etch is preferably selective to the metal portion 40. Further, the reactive ion etch is selective to at least one of the high-k material layer 30L and the shallow trench isolation structure 20. In case the reactive ion etch is not selective to the high-k material layer and selective to the shallow trench isolation structure, an opening in the second photoresist 57 is preferably confined within the area of the shallow trench isolation structure 20 to avoid etching of the semiconductor layer 10.

After the reactive ion etch, a horizontal cross-sectional area of the semiconductor portion 50 is confined within, i.e., is a non-identical subset of, a horizontal cross-sectional area of the metal portion 40. At least one sidewall of the semiconductor portion 50 and at least one sidewall of the metal portion 40 are not vertically coincident. In case the second photoresist 57 covers at least another sidewall of the semiconductor portion 50 and at least another sidewall of the metal portion 40, the at least another sidewall of the semiconductor portion 50 and the at least another sidewall of the metal portion 40 may be vertically coincident after the reactive ion etch and subsequent removal of the second photoresist 57.

Figure 4A:
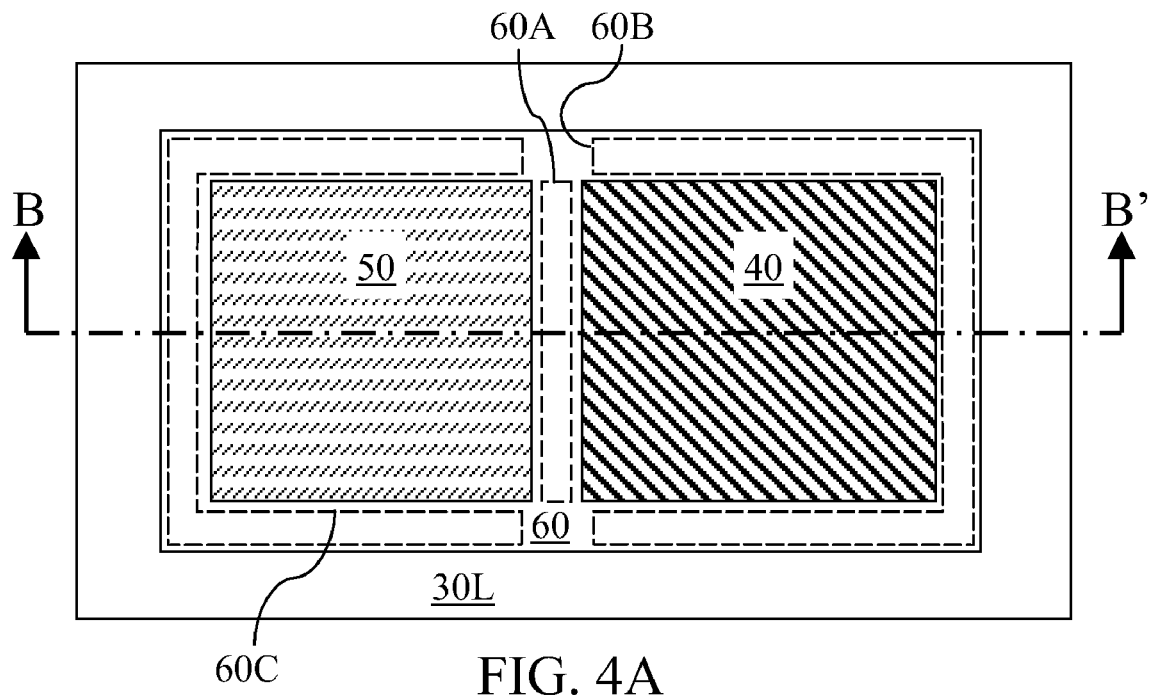
Figure 4B:
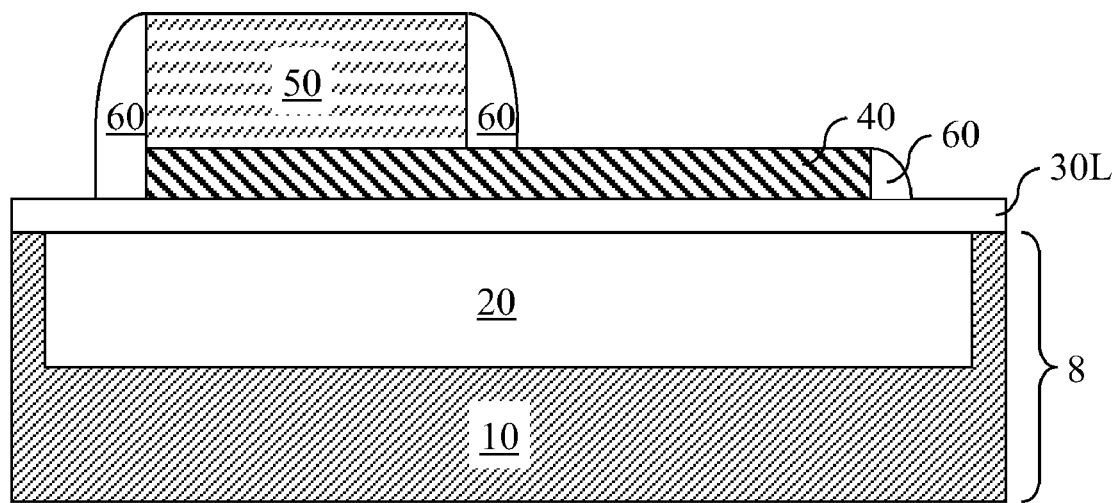
Figure 5A:
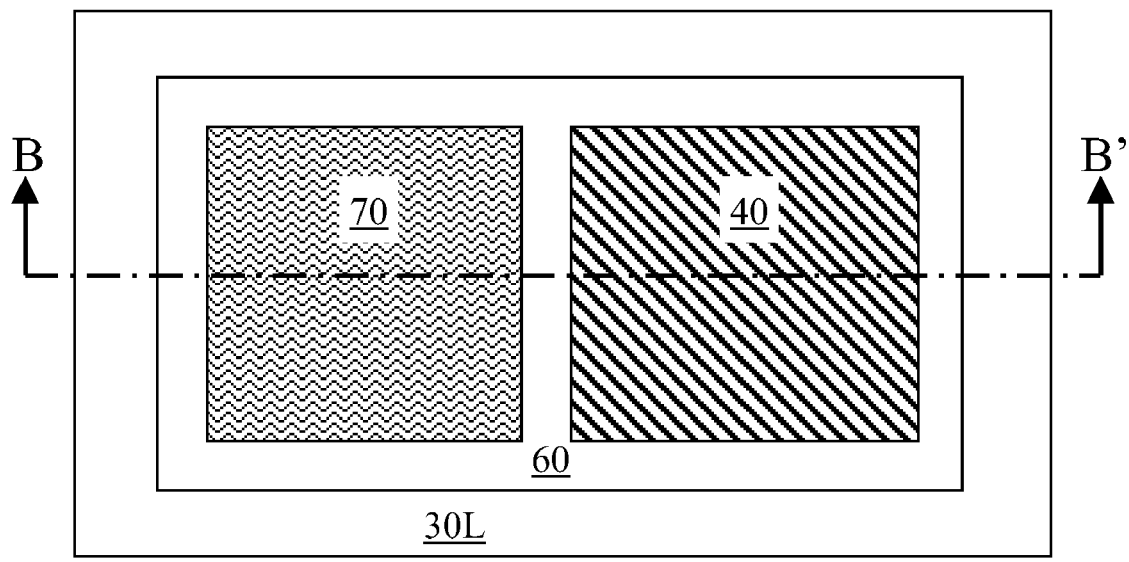
Figure 5B:
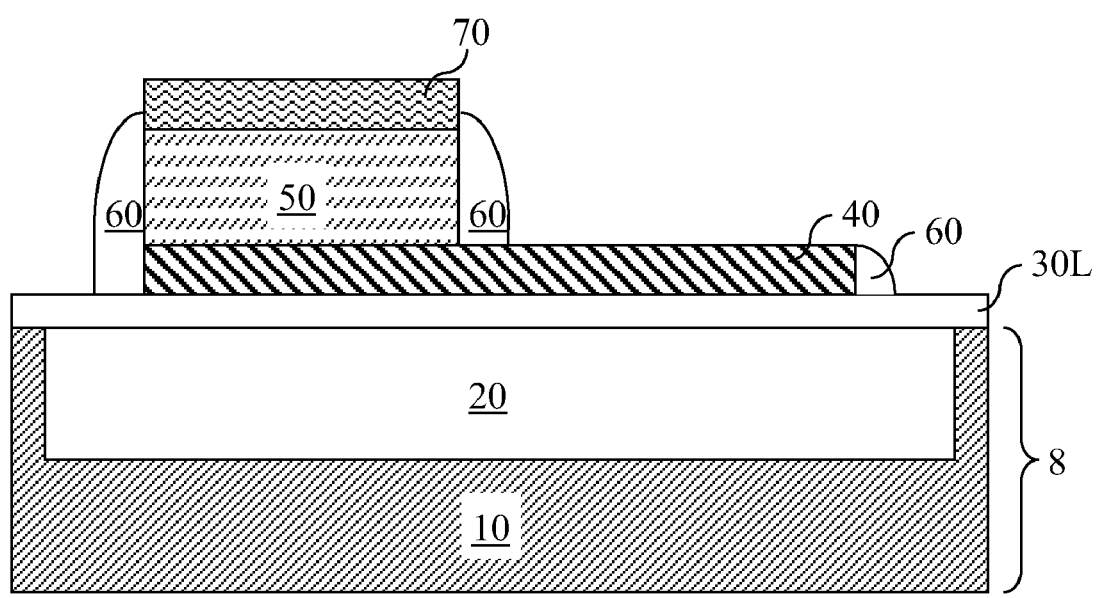

Referring to FIGS. 4A-4B, a dielectric spacer 60 is formed on the sidewalls of the metal portion 40 and the semiconductor portion 60 by a conformal deposition of a dielectric layer followed by an anisotropic etch such as a reactive ion etch. The dielectric spacer 60 comprises a dielectric material such as dielectric oxide and dielectric nitride. For example, the dielectric spacer 60 may comprise silicon nitride, silicon oxide, or a combination thereof.

The dielectric spacer 60 comprises a first dielectric spacer portion 60A that laterally abuts the semiconductor portion 50 and vertically abuts a portion of the substantially planar top surface of the metal layer 40. The dielectric spacer 60 further comprises a second spacer portion 60B that laterally abuts the metal portion 40, is disjoined from the semiconductor portion 50, and is located beneath the substantially planar top surface of the metal portion 40. The dielectric spacer 60 may further comprise a third spacer portion 60C that laterally abuts both the metal portion 40 and the semiconductor portion 50.

The dielectric spacer 60 may be formed concurrently with formation of gate spacers on the metal gate stack of the metal gate device described above. Source and drain ion implantation may be performed to implant dopants into portions of the substrate layer 10 to form source and drain regions (not shown) in the metal gate device.

Metallization is performed on a top sub-portion of the semiconductor portion 50 by reacting a metal with the semiconductor material in the sub-top portion of the semiconductor portion 50 to form a metal semiconductor alloy portion 70. The metal semiconductor alloy portion 70 vertically abuts the semiconductor portion 50, which now comprises an unreacted sub-portion of the semiconductor portion 50 prior to the metallization. The metal semiconductor alloy further abuts a top portion of the dielectric spacer 60. The thickness of the metal semiconductor alloy portion 70 may be from about 10 nm to about 40 nm, and preferably from about 15 nm to about 30 nm, although lesser and greater thicknesses are explicitly contemplated herein also.

Methods of forming various metal semiconductor alloys are known in the art. In case the semiconductor portion 50 comprise silicon, the metal semiconductor alloy portion 70 comprises a metal silicide such as such as nickel silicide ($NiSi_x$), cobalt silicide ($CoSi_x$), tantalum silicide ($TaSi_x$), and titanium silicide ($TiSi_x$), tungsten silicide ($WSi_x$), platinum silicide ($PtSi_x$) or alloys thereof, in which values of x may be typically between 1 and 3.

Figure 6A:
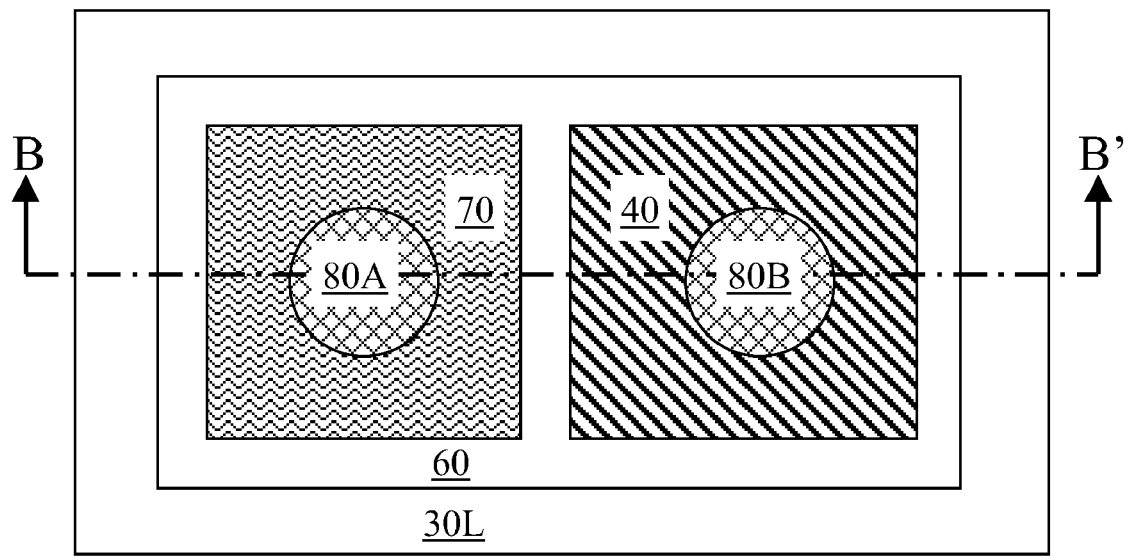
Figure 6B:
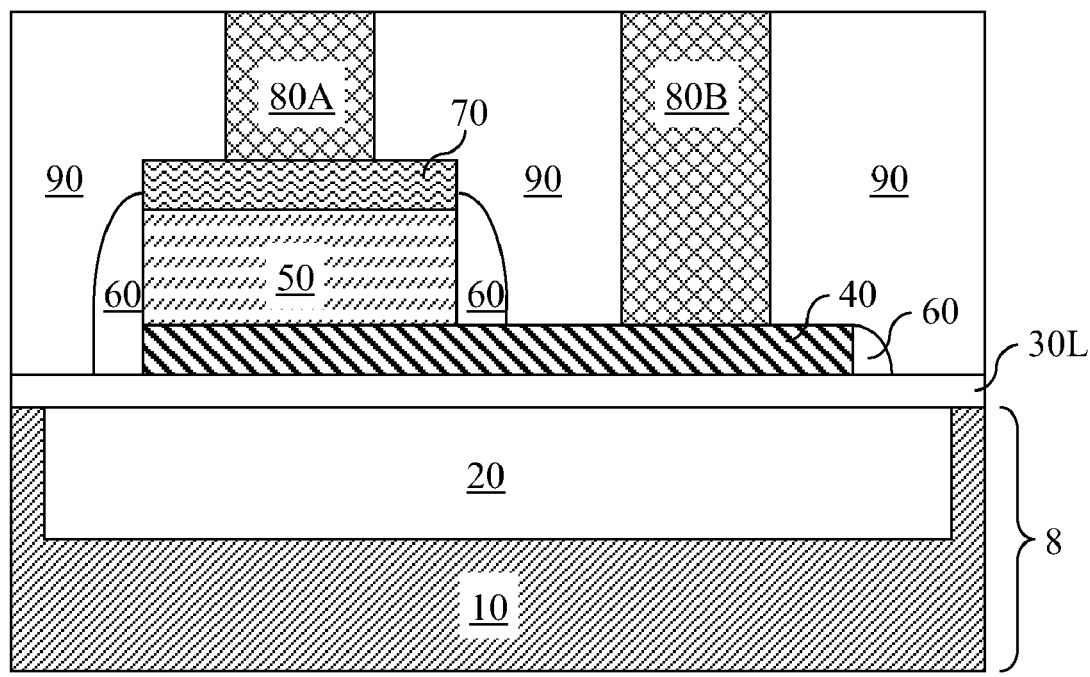

Referring to FIGS. 6A and 6B, a middle-of-line (MOL) insulator layer 90 is deposited over the metal semiconductor alloy portion 70, the metal portion 40, and the dielectric spacer 60. The MOL insulator layer 90 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL insulator layer 90 may be from about 200 nm to about 500 nm. Alternately, the MOL insulator layer 90 may comprise an organosilicate glass (OSG) having a dielectric constant value of less than 2.8. The MOL insulator layer 90 is preferably planarized, for example, by chemical mechanical polishing (CMP). Alternately, the MOL insulator layer 90 may be a self-planarizing material such as a spin-on glass (SOG) or a spin-on low-k dielectric material such as SiLK™.

Various contact via holes are formed in the MOL insulator layer 90 and filled with metal to form various contact vias. Specifically, a first contact via 80A is formed directly on the metal semiconductor alloy portion 70, and a second contact via 80B is formed directly on the metal portion 40. A first level metal wiring (not shown) may thereafter be formed, followed by formation of back-end-of-line (BEOL) structures.

The first exemplary semiconductor structure in FIGS. 6A and 6B includes a first electrical antifuse according to the present invention, which comprises:

a metal portion 40 having a substantially planar top surface and located on a substrate, which is the semiconductor substrate 8;

a semiconductor portion 50 vertically abutting a portion of the substantially planar top surface;

a metal semiconductor alloy portion 70 vertically abutting a top surface of the semiconductor portion 50, wherein another portion of the substantially planar top surface vertically abuts an insulator layer 90, which is the MOL insulator layer 90;

a first contact via 80A vertically abutting the metal semiconductor alloy portion 70; and a second contact via 80B vertically abutting the another portion of the substantially planar top surface.

The first electrical antifuse may be left intact without programming or may be programmed by inducing electromigration therein. Programming or lack of programming on the first electrical antifuse, which results in presence or absence of an electrical short between the first contact via 80A and the second contact via 80B, determines the bit of information stored in the inventive electrical antifuse.

Figure 7A:
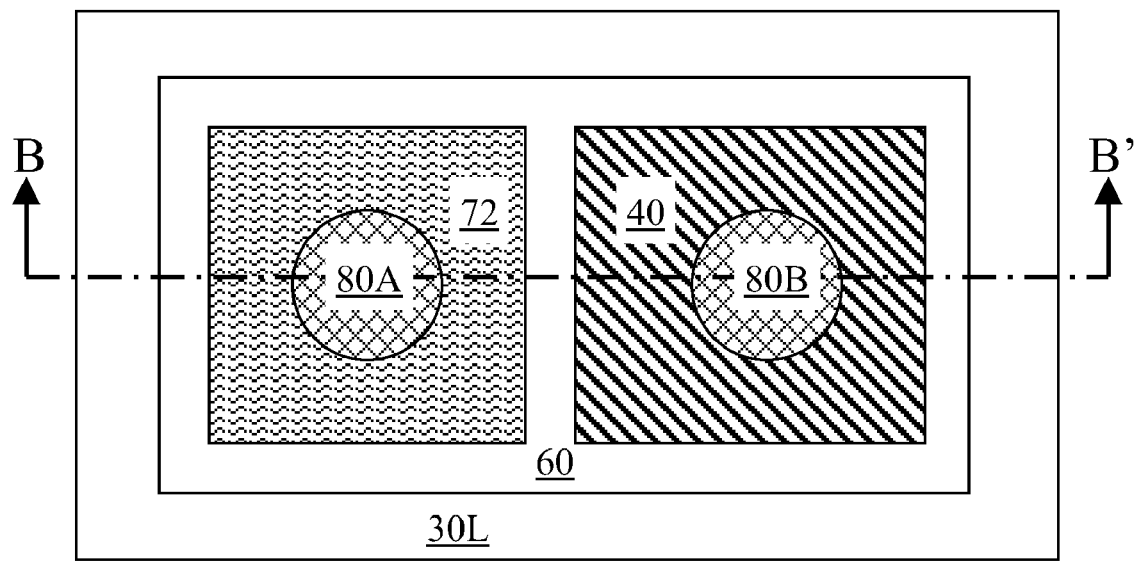
FIGS. 7A and 7B are a top-down view and a vertical cross-sectional view of the first exemplary semiconductor structure, respectively, after programming of an electrical antifuse according to the present invention. The insulator layer 90 is omitted in FIG. 7A.
Figure 7B:
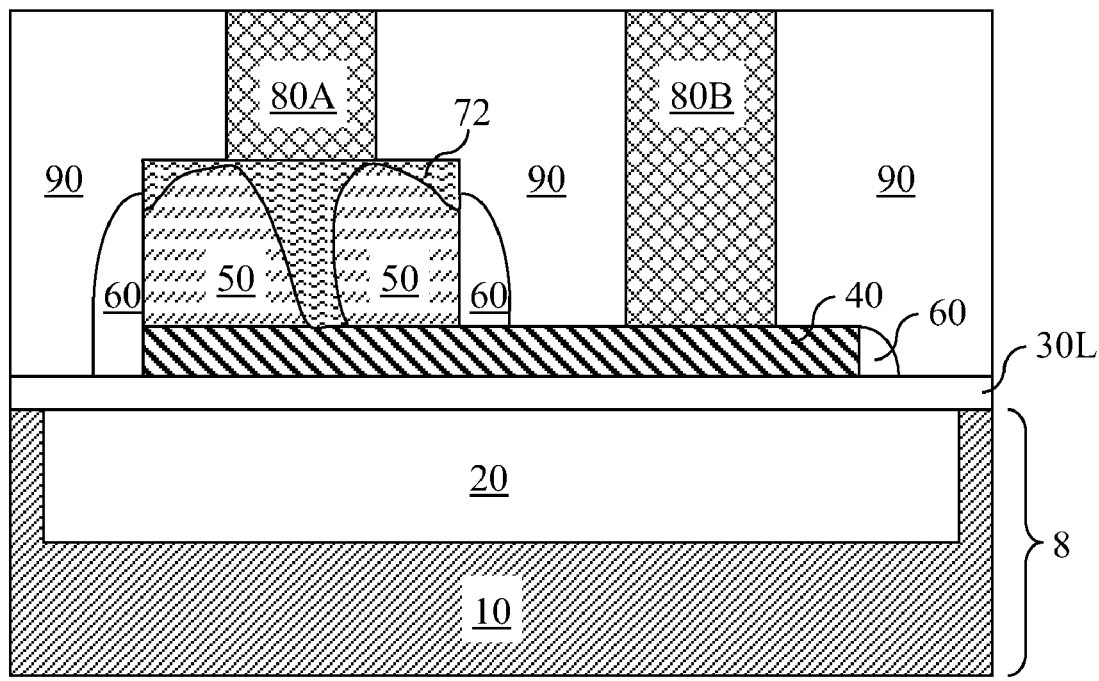

Referring to FIGS. 7A and 7B, an exemplary structure of the first electrical antifuse after programming is shown. Programming of the first electrical antifuse is effected by applying an electrical bias across the first contact via 80A and the second contact via 80B. Depending on the thickness and resistivity of the semiconductor material in the semiconductor portion 50, the voltage and/or current required to induce electromigration through the semiconductor portion 50 varies widely. In case the semiconductor portion 50 is doped, i.e., contains electrical dopants to reduce the resistivity of the semiconductor portion, the resistivity of the semiconductor portion 50 may be from about $1.0 \times 10^2$ $\Omega$-cm to about $10 \times 10^{-4}$ $\Omega$-cm. In case the semiconductor portion 50 is undoped, i.e., dopants are not intentionally introduced into the semiconductor portion 50, the resistivity of the semiconductor material in the semiconductor portion may be greater than $1.0 \times 10^{-4}$ $\Omega$-cm. Thus, the voltage needed to induce electromigration in the semiconductor portion 50 may be from about 0.8V to about 24 V, and typically from about 1.2V to about 8V, and more typically from about 1.5V to about 4.0V, although lesser and greater voltages are also explicitly contemplated herein.

The electromigration that occurs during programming of the first electrical antifuse causes an electrical short between the first contact via 80A and the second contact via 80B since the electromigrated metal semiconductor alloy portion 72 provides a metallic conduction path between the first contact via 80A and the metal portion 40. In other words, the electromigrated metal semiconductor alloy portion 72 forms an electrical short between the first contact via 80A and the metal portion 40.

A sense circuit (not shown) may be connected to the first electrical antifuse to determine the state thereof. The sense circuit may be based on measurement of resistance or capacitance of the first electrical antifuse. In case the sense circuit employs a resistance measurement for detection of the status of the antifuse, the resistance of an intact first electrical antifuse is greater than a reference resistance, while the resistance of a programmed first electrical antifuse is less than the reference resistance. In case the sense circuit employs a capacitance measurement for detection of the status of the antifuse, the capacitance of an intact first electrical antifuse is greater than a reference capacitance, while the capacitance of a programmed first electrical antifuse is less than the reference capacitance.

Figure 8A:
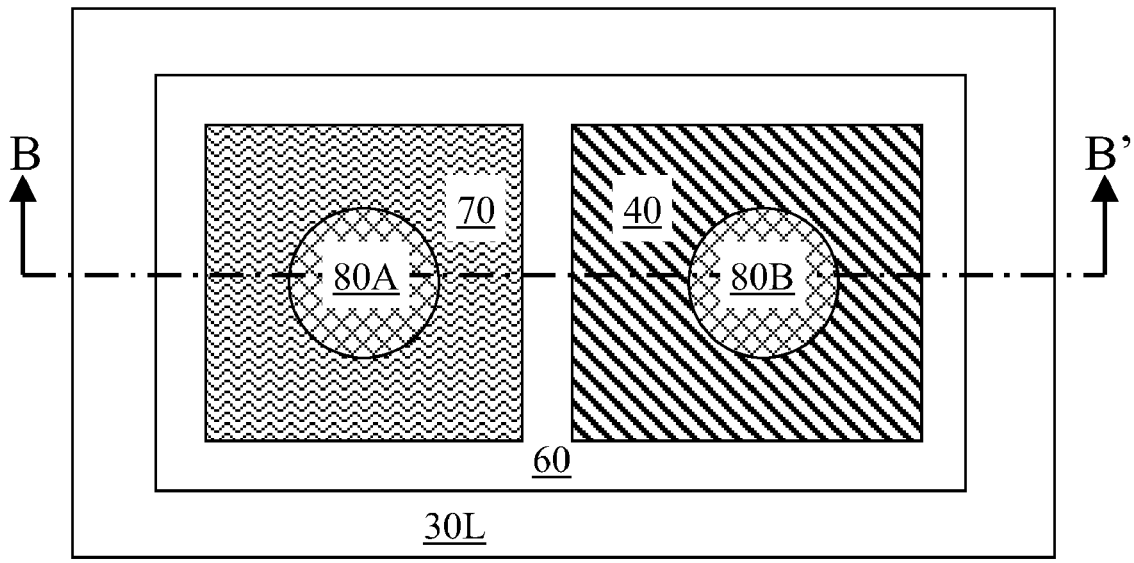
FIGS. 8A and 8B are a top-down view and a vertical cross-sectional view of a second exemplary semiconductor structure, respectively, according to a second embodiment of the present invention.
Figure 8B:
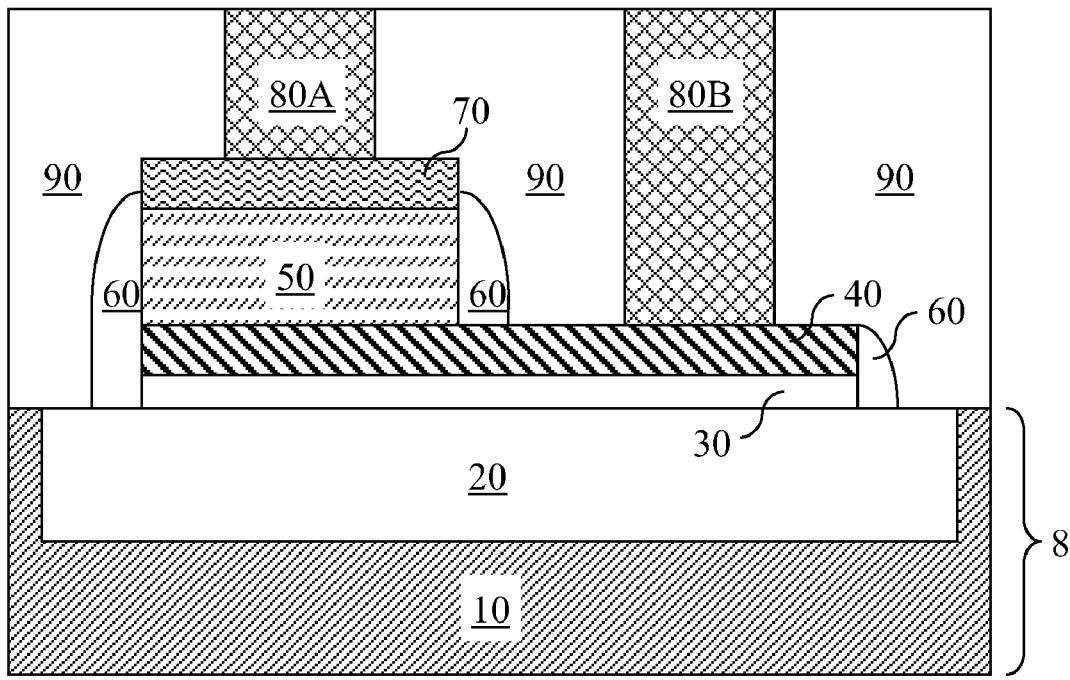

Referring to FIGS. 8A and 8B, a second exemplary semiconductor structure according to a second embodiment of the present invention comprises a high dielectric constant material portion 30 having substantially vertically coincident sidewalls as the stack of the metal portion 40 and the semiconductor portion 50. The second exemplary semiconductor structure may be formed by extending the reactive ion etch that is employed for formation of the stack of the metal portion 40 and the semiconductor portion 50 according to the first embodiment so that exposed portions of the high dielectric constant material layer 30L are removed by the reactive ion etch. Alternatively, a different etch such as a wet etch may be employed to remove the exposed portions of the high dielectric constant material layer 30L. Preferably, the etch chemistry employed for removal of the exposed portions of the high dielectric constant material layer 30L is selective to the shallow trench isolation structure 20 and/or the semiconductor layer 10. In the second exemplary semiconductor structure, the high dielectric constant material portion 30 is limited to a region directly above the shallow trench isolation structure 20.

Figure 9A:
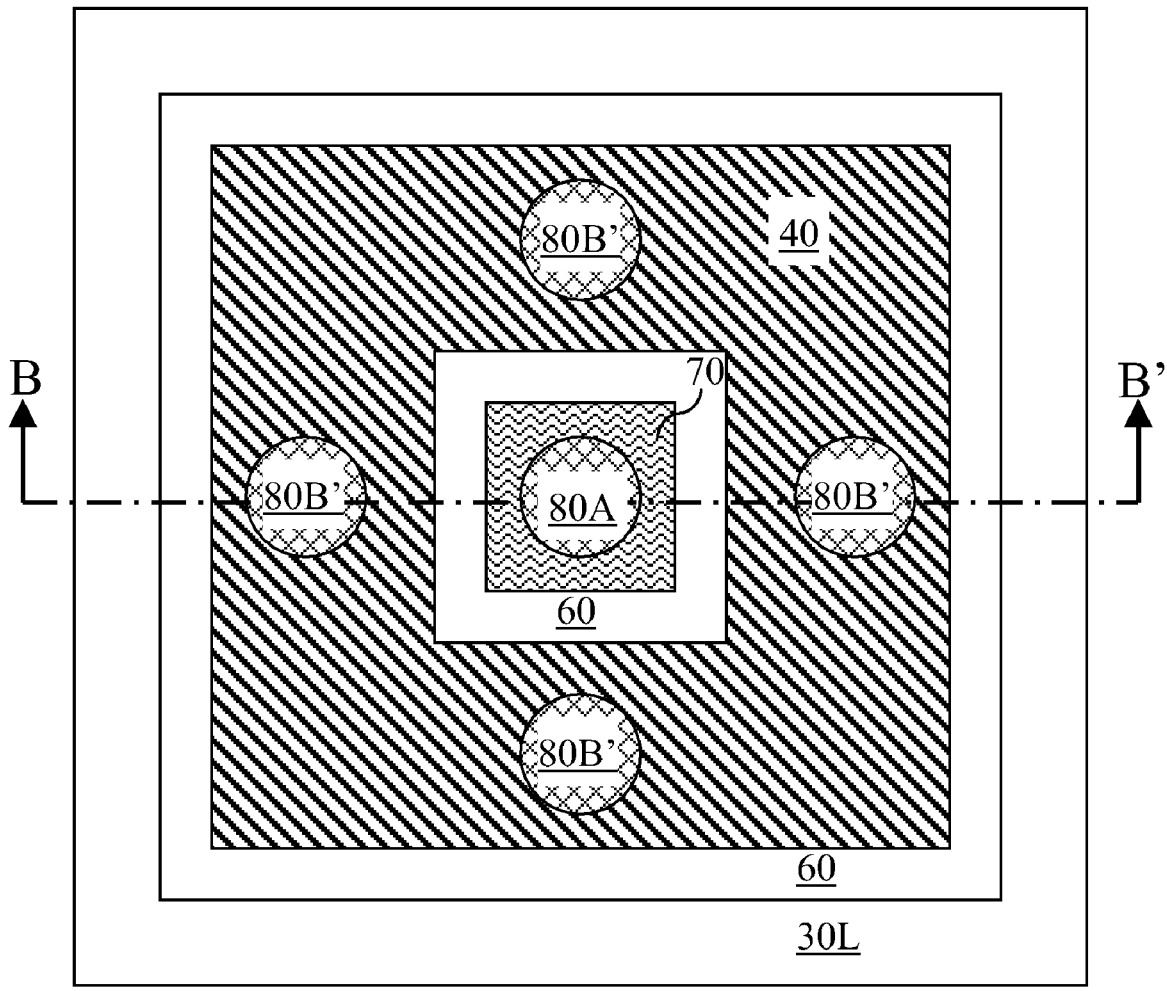
FIGS. 9A and 9B are a top-down view and a vertical cross-sectional view of a third exemplary semiconductor structure, respectively, according to a third embodiment of the present invention.
Figure 9B:
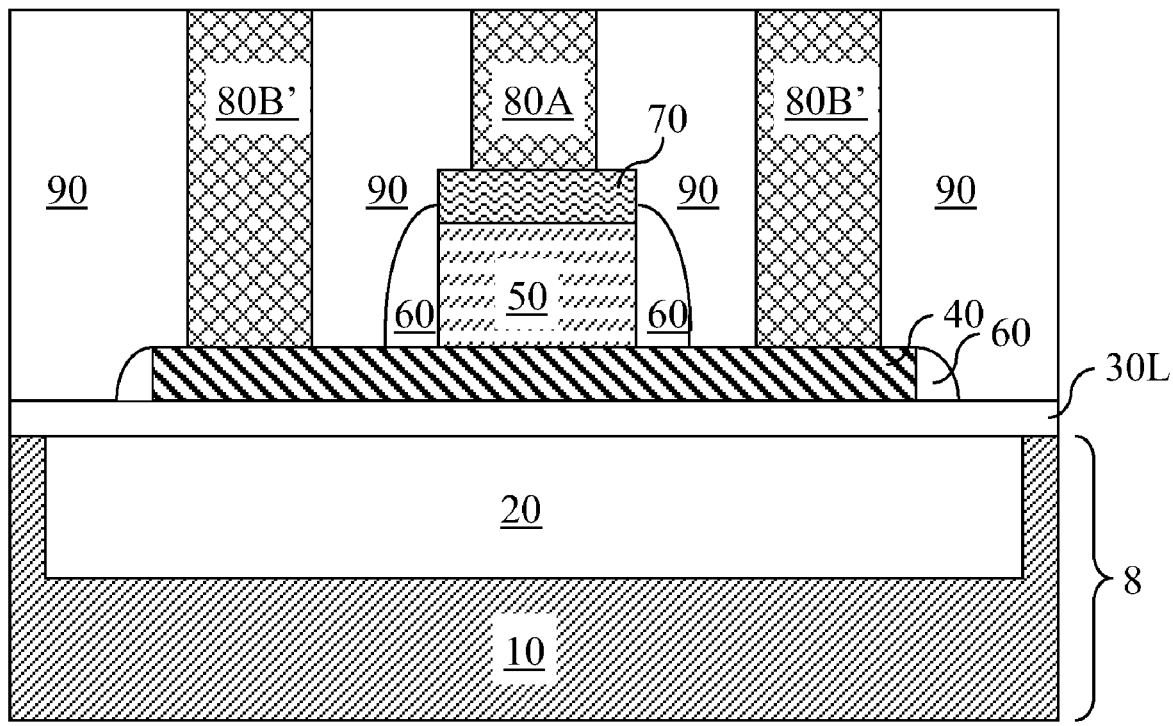

Referring to FIGS. 9A and 9B, a third exemplary semiconductor structure according to a third embodiment of the present invention comprises a first contact via 80A and a plurality of second contact vias 80B'. The dielectric spacer 60 comprises two disjoined portions, which include an upper dielectric spacer portion and a lower dielectric spacer portion. The upper dielectric spacer portion laterally abuts the semiconductor portion 50 and vertically abuts a portion of the substantially planar top surface of the metal layer 40. The lower spacer portion laterally abuts the metal portion 40, is disjoined from the semiconductor portion 50, and is located beneath the substantially planar top surface of the metal portion 40.

Variations of the first through third embodiments are herein contemplated also in which a high dielectric constant material potion is employed instead of a high dielectric constant material layer as in the second embodiment. Other variations of the first through third embodiments are herein contemplated also in which a plurality of first contact vias are employed instead of a single first contact via. Yet other variations of the first through third embodiments are herein contemplated also in which an exposed sub-portion of the metal portion is contacted by a second contact via and the exposed sub-portion of the metal portion is surrounded by a stack of the metal portion, a semiconductor portion, and a metal semiconductor alloy portion, in which the stack of the semiconductor portion and the metal semiconductor alloy portion surrounds the exposed sub-portion of the metal portion and has a shape of a ring.

Figure 10A:
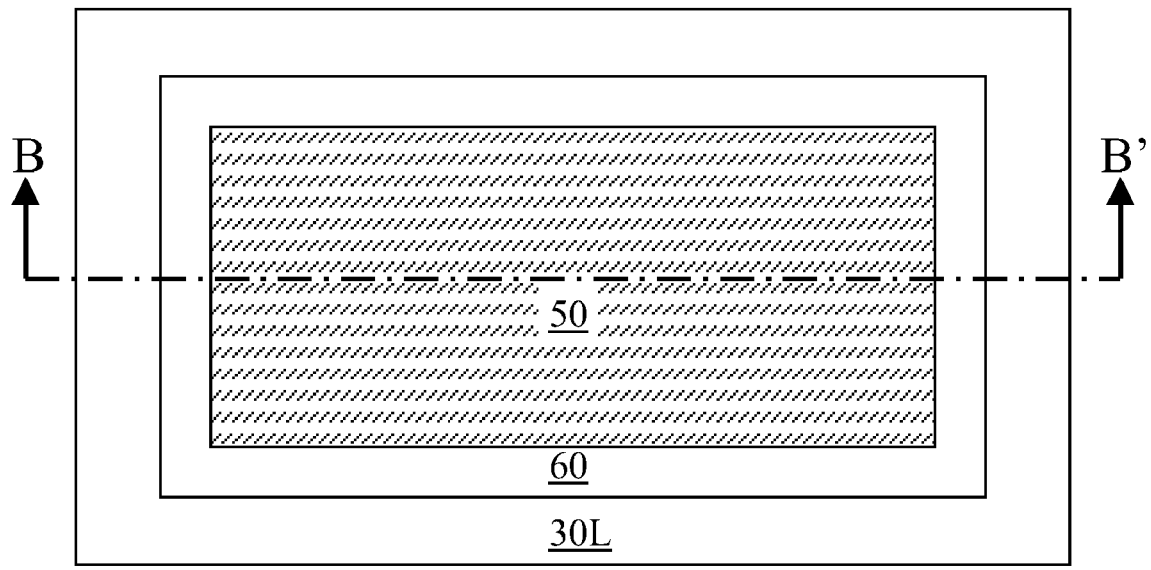
FIGS. 10A-12B are sequential views of a fourth exemplary structure according to a fourth embodiment of the present invention during various stages of manufacturing. Figures with the same numeric label correspond to the same stage of manufacturing. Figures with the suffix "A" are top-down views, and figures with the suffix "B" are vertical cross-sectional views along the plane B-B' of the corresponding figure with the same numeric label and the suffix "A." Insulator layer 90 is omitted in FIG. 12A.
Figure 10B:
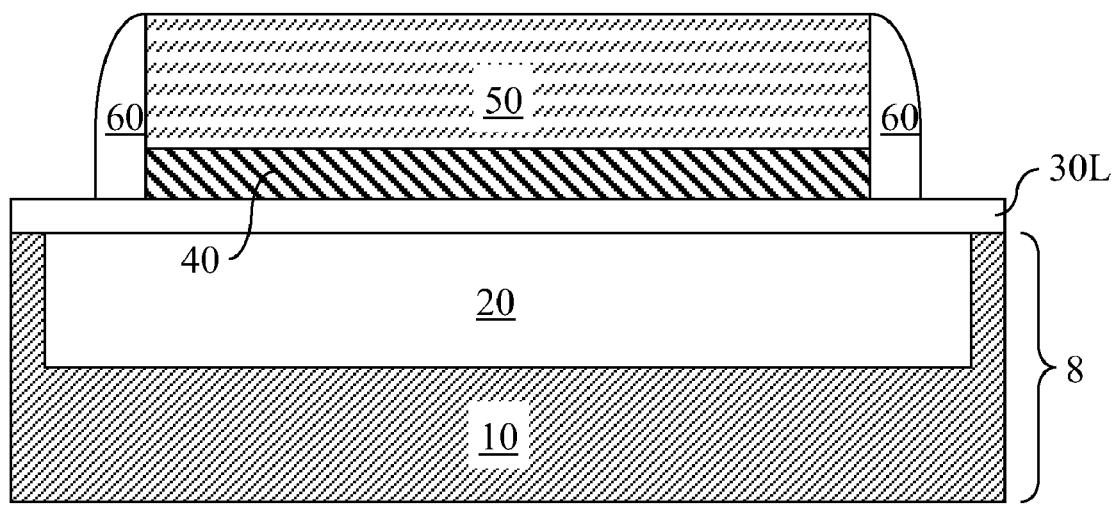

Referring to FIGS. 10A and 10B, a fourth exemplary semiconductor structure according to a fourth embodiment of the present invention is derived from the first exemplary semiconductor structure according to the first embodiment by removing the first photoresist 53 from, and forming a dielectric spacer 60 on the first exemplary semiconductor structure in FIGS. 2A and 2B. The fourth exemplary semiconductor structure comprises a stack of a metal portion 40 and a semiconductor portion 50, in which the set of sidewalls of the metal portion 40 and the set of sidewalls of the semiconductor portion 50 are vertically coincident, i.e., the set of sidewalls of the metal portion 40 and the set of sidewalls of the semiconductor portion 50 align to each other in a top-down view such as FIG. 10A. Preferably, the entirety of the set of sidewalls of the metal portion 40 overlies the shallow trench isolation structure. In this case, the shallow trench isolation structure provided thermal isolation of the inventive electrical antifuse from the semiconductor substrate 8.

The dielectric spacer 60 may be formed on the sidewalls of the metal portion 40 and the semiconductor portion 60 by a conformal deposition of a dielectric layer followed by an anisotropic etch such as a reactive ion etch. The dielectric spacer 60 comprises a dielectric material such as dielectric oxide and dielectric nitride. For example, the dielectric spacer 60 may comprise silicon nitride, silicon oxide, or a combination thereof. The dielectric spacer 60 laterally abuts and encloses the sidewalls of the metal portion 40 and the sidewalls of the semiconductor portion 50. The dielectric spacer 60 may be of unitary construction, i.e., in one piece, and may have a hole in the middle. The dielectric spacer 60 may be topologically homeomorphic to a torus, i.e., may be continually stretched and bent without cutting, forming a new hole, or eliminating a hole, into a torus.

Figure 11A:
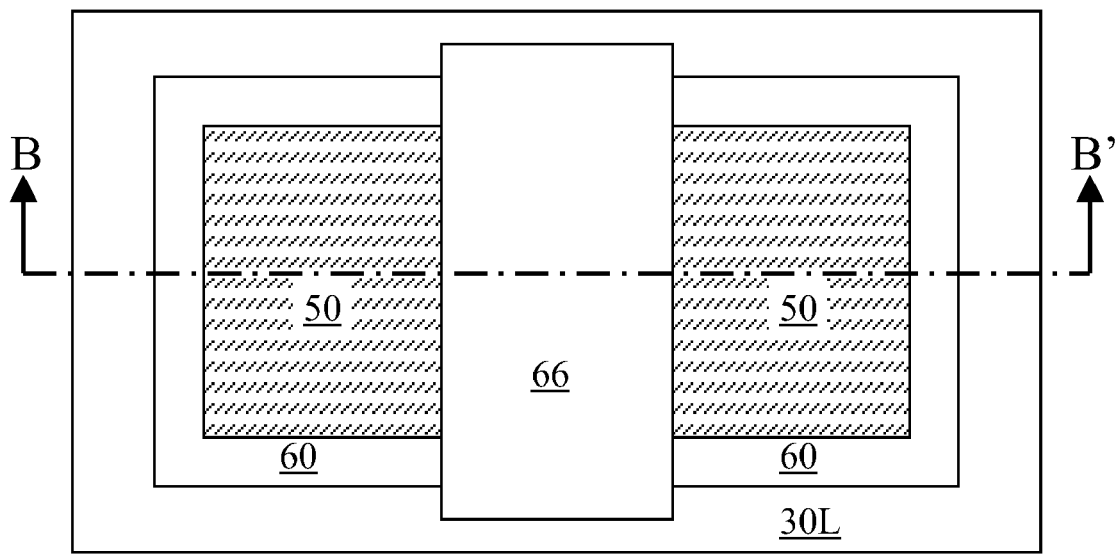
Figure 11B:
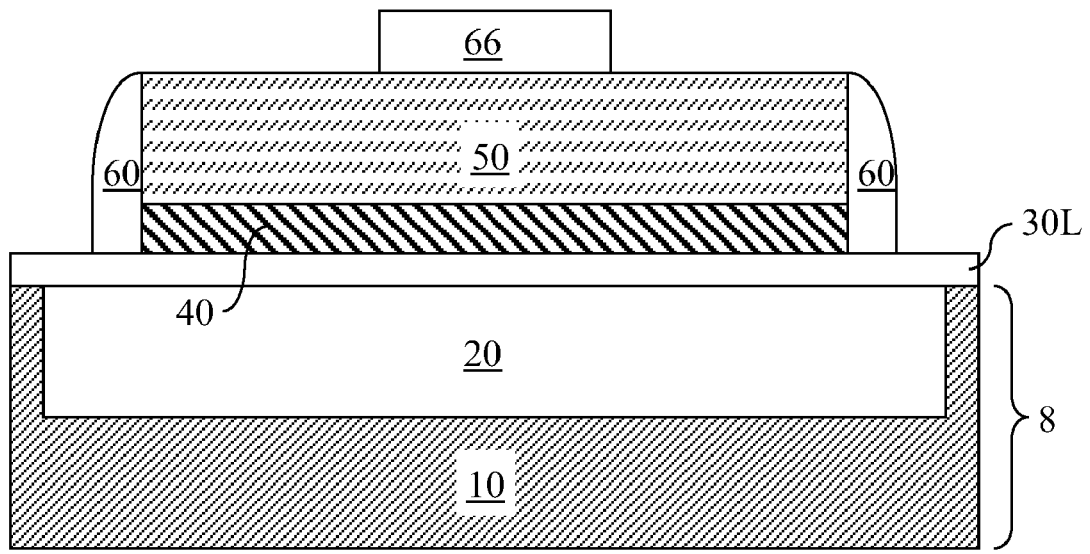

Referring to FIGS. 11A and 11B, a dielectric material portion 66 is formed over the semiconductor portion. The dielectric material portion 66 comprises a dielectric material such as a dielectric oxide or a dielectric nitride. For example, the dielectric material portion may comprise silicon nitride. The dielectric material portion 66 may be formed by deposition of a dielectric material layer (not shown) followed by lithographic patterning of the dielectric material. The thickness of the dielectric material portion 66 may be from about 10 nm to about 150 nm, and typically from about 20 nm to about 80 nm.

The dielectric material portion 66 is formed so that a first end portion and a second end portion of the semiconductor portion 50 are exposed after formation of the dielectric material portion 66. The first end portion of the semiconductor portion 50 is located on one side of the dielectric material portion 66, and the second portion of the semiconductor portion 50 is located on the other side of the dielectric material portion 66. The first end portion and the second end portion of the semiconductor portion 50 are disjoined from each other.

Figure 12A:
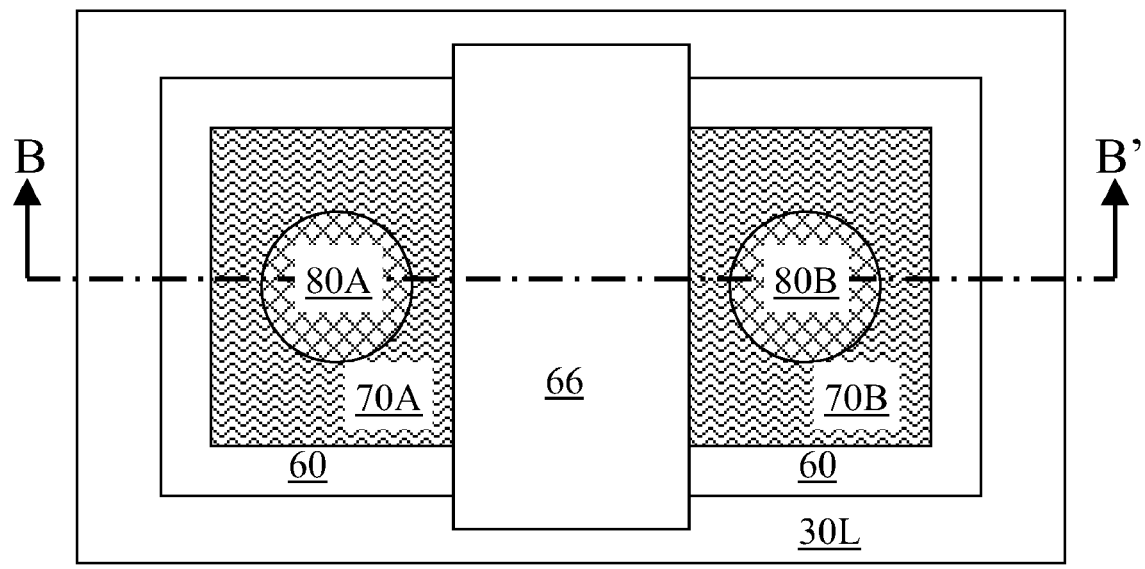
Figure 12B:
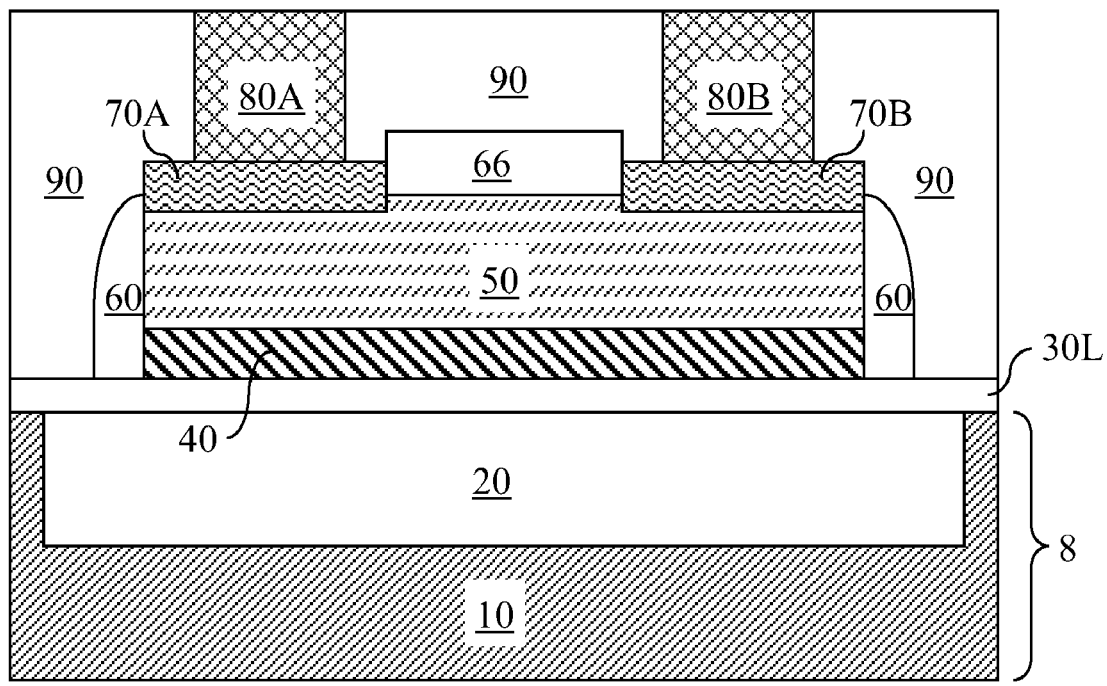

Referring to FIGS. 12A and 12B, metallization is performed on a top sub-portion of the semiconductor portion 50 by reacting a metal with the semiconductor material in the sub-top portion of the semiconductor portion 50 to form a first metal semiconductor alloy portion 70A and a second metal semiconductor alloy portion 70B. The same methods as in the first embodiment may be employed for the metallization process.

A middle-of-line (MOL) insulator layer 90 is deposited over the first metal semiconductor alloy portion 70A, the second metal semiconductor alloy portion 70B, and the dielectric spacer 60. The MOL insulator layer 90 may comprise the same material, be formed by the same method, and have the same thickness, as in the first embodiment.

Various contact via holes are formed in the MOL insulator layer 90 and filled with metal to form various contact vias. Specifically, a first contact via 80A is formed directly on the first metal semiconductor alloy portion 70, and a second contact via 80B is formed directly on the second metal semiconductor alloy portion 70B. A first level metal wiring (not shown) may thereafter be formed, followed by formation of back-end-of-line (BEOL) structures.

The fourth exemplary semiconductor structure in FIGS. 12A and 12B includes a second electrical antifuse according to the present invention, which comprises:

a metal portion 40 located on a substrate, which is the semiconductor substrate 8;

a semiconductor portion 50 vertically abutting the metal portion 40; and a first metal semiconductor alloy portion 70A vertically abutting a first portion of a top surface of the semiconductor portion 50;

a second metal semiconductor alloy portion 70B vertically abutting a second portion of the top surface of the semiconductor portion 50 and disjoined from the first metal semiconductor alloy portion 70A;

a dielectric material portion 66 laterally abutting a sidewall of the first metal semiconductor alloy portion 70A and the second metal semiconductor alloy portion 70B; and an insulator layer 90 abutting the first metal semiconductor alloy portion 70A, the second metal semiconductor alloy portion 70B, and the dielectric material portion 66.

Figure 13A:
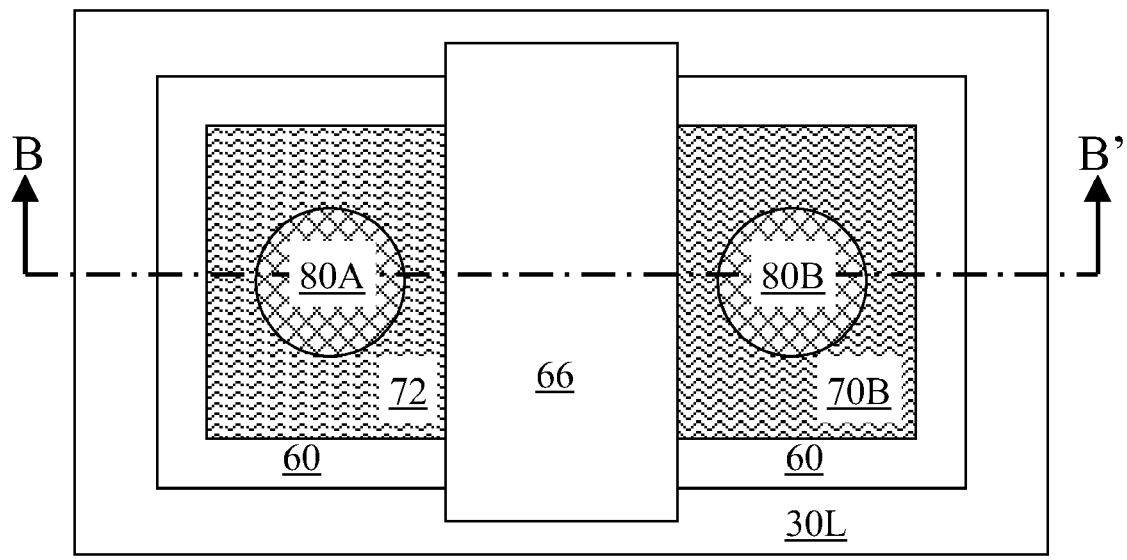
FIGS. 13A and 13B are a top-down view and a vertical cross-sectional view of the fourth exemplary semiconductor structure, respectively, after programming of an electrical antifuse according to the present invention. Insulator layer 90 is omitted in FIG. 13A.
Figure 13B:
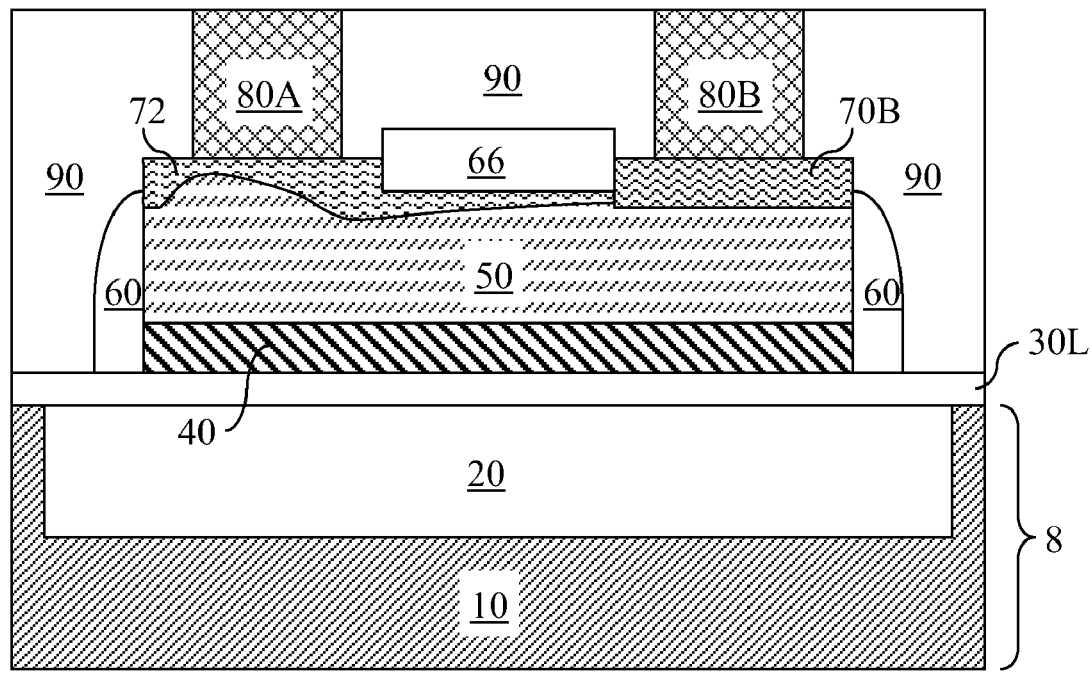

A bit of information may be stored in the electrical antifuse by programming or not programming the inventive electrical antifuse. Referring to FIGS. 13A and 13B, an exemplary structure of the second electrical antifuse after programming is shown. Programming of the second electrical antifuse is effected by applying an electrical bias across the first contact via 80A and the second contact via 80B. Depending on the thickness and resistivity of the semiconductor material in the semiconductor portion 50, the voltage and/or current required to induce electromigration through the semiconductor portion 50 varies widely. Thus, the voltage needed to induce electromigration in the semiconductor portion 50 may be from about 0.8V to about 24 V, and typically from about 1.2V to about 8V, and more typically from about 1.5V to about 4.0V, although lesser and greater voltages are also explicitly contemplated herein.

As in the first through third embodiments, the electromigration that occurs during programming of the second electrical antifuse causes an electrical short between the first contact via 80A and the second contact via 80B since the electromigrated metal semiconductor alloy portion 72 provides a metallic conduction path between the first contact via 80A and the second contact via 80B. In other words, the electromigrated metal semiconductor alloy portion 72 forms an electrical short between the first contact via 80A and the second metal semiconductor alloy portion 70B.

A sense circuit (not shown) may be connected to the second electrical antifuse to determine the state thereof. The sense circuit may be based on measurement of resistance or capacitance of the second electrical antifuse as in the first through third embodiments.

Figure 14A:
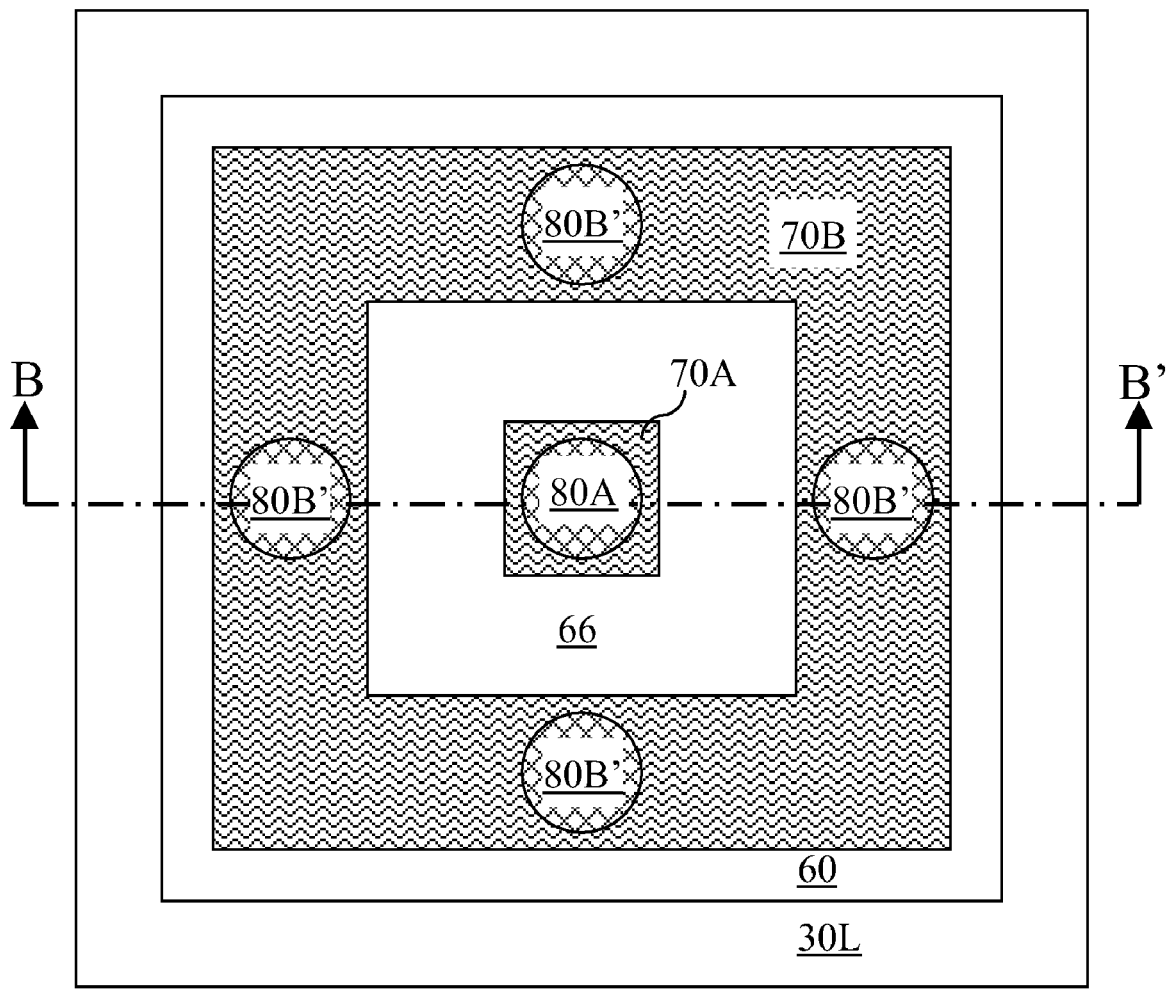
FIGS. 14A and 14B are a top-down view and a vertical cross-sectional view of a fifth exemplary semiconductor structure, respectively, according to a fifth embodiment of the present invention.
Figure 14B:
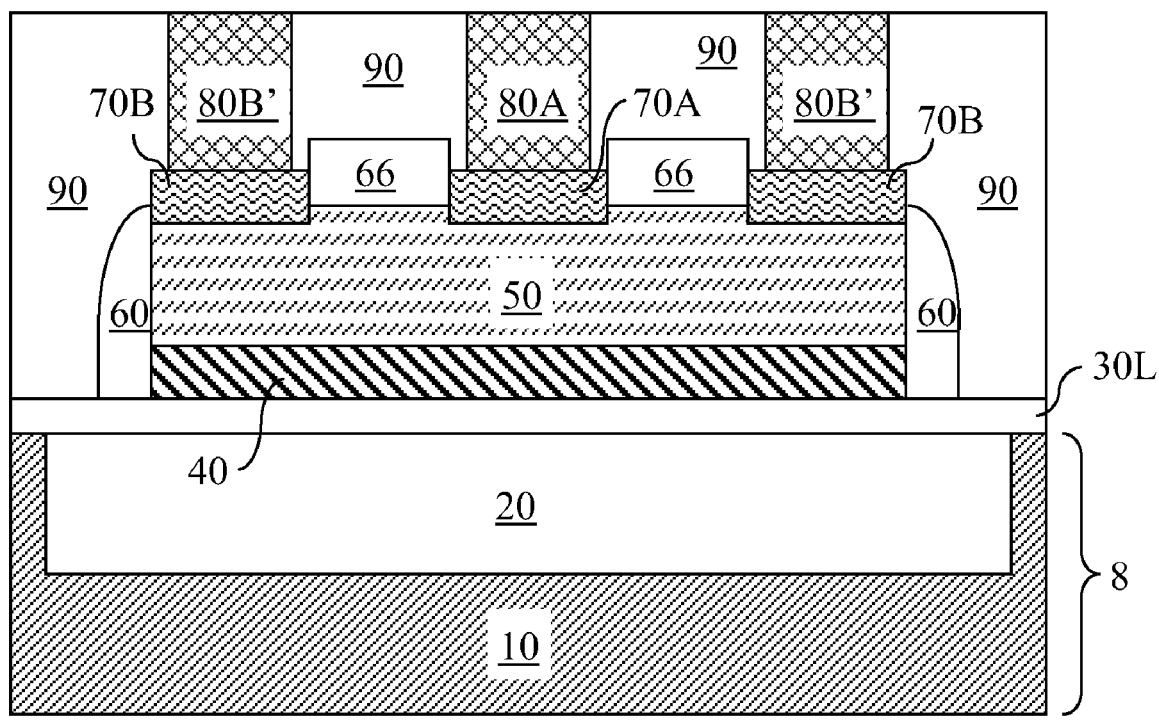

Referring to FIGS. 14A and 14B, a fifth exemplary semiconductor structure according to a fifth embodiment of the present invention comprises a first contact via 80A and a plurality of second contact vias 8OB'. The dielectric material portion 66 laterally abuts and encloses the first metal semiconductor alloy portion 70A. The second metal semiconductor alloy portion 70B laterally abuts and encloses the dielectric material portion 66.

Variations of the fourth and fifth embodiments are herein contemplated also in which a high dielectric constant material potion is employed instead of a high dielectric constant material layer as in the second embodiment. Other variations of the first through third embodiments are herein contemplated also in which a plurality of first contact vias are employed instead of a single first contact via.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a metal portion having a substantially planar top surface and located on a high dielectric constant material layer having a dielectric constant greater than 4.0 said high dielectric constant material is located on an upper surface of a semiconductor substrate;
    a semiconductor portion located directly on a portion of said substantially planar top surface of said metal portion;
    a metal semiconductor alloy portion located on a top surface of said semiconductor portion;
    an insulator layer located directly on another portion of said substantially planar top surface of said metal portion and on a portion of an upper surface of said metal semiconductor alloy portion;
    a first dielectric spacer portion having one edge that is located on a sidewall of said semiconductor portion and having a base that is located directly on said another portion of said substantially planar top surface of said metal portion;
    a second dielectric spacer portion having an edge that is located on a sidewall of said metal portion, disjoined from said semiconductor portion, and having a base located beneath said substantially planar top surface of said metal portion; and
    a third dielectric spacer portion having an edge that is located on sidewalls of said semiconductor portion and said metal portion and having a base located beneath said substantially planar surface of said metal portion.

2. The semiconductor structure of claim 1, further comprising:
    a first contact via vertically abutting said metal semiconductor alloy portion; and
    a second contact via vertically abutting said another portion of said substantially planar top surface.

3. The semiconductor structure of claim 1, wherein said high dielectric constant material layer comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from about 0.5 to about 3 and each value of y is independently from 0 to about 2.

4. The semiconductor structure of claim 1, wherein said semiconductor portion comprises one of an undoped silicon containing semiconductor material and a doped silicon containing semiconductor material.

5. A semiconductor structure comprising:
    a metal portion located on a high dielectric constant material layer having a dielectric constant greater than 4.0 said high dielectric constant material is located on an upper surface of a semiconductor substrate;
    a semiconductor portion located directly on an upper surface of said metal portion;
    a first metal semiconductor alloy portion located on a first portion of a top surface of said semiconductor portion;
    a second metal semiconductor alloy portion located on a second portion of said top surface of said semiconductor portion, wherein said second metal semiconductor alloy portion is disjoined from said first metal semiconductor alloy portion by a dielectric material portion, said dielectric material portion is in direct contact with a sidewall of said first metal semiconductor alloy portion and a sidewall of said second metal semiconductor alloy portion and is located atop a third portion of said top surface of said semiconductor portion;
    a first dielectric spacer portion having an edge that is in contact with sidewalls of said metal portion, said semiconductor portion and said first metal semiconductor alloy portion, and having a base located directly on an upper surface of the high dielectric constant material layer; and
    a second dielectric spacer portion having an edge that is in contact with sidewalls of said metal portion, said semiconductor portion and said second metal semiconductor alloy portion, and having a base located directly on an upper surface of the high dielectric constant material layer.

6. The semiconductor structure of claim 5, further comprising:
    an insulator layer abutting said first metal semiconductor alloy portion, said second metal semiconductor alloy portion, and said dielectric material portion.

7. The semiconductor structure of claim 5, further comprising:
    a first contact via vertically abutting said first metal semiconductor alloy portion; and
    a second contact via vertically abutting said second metal semiconductor alloy portion.

8. The semiconductor structure of claim 5, wherein said semiconductor portion comprises one of an undoped silicon containing semiconductor material and a doped silicon containing semiconductor material.

* * * * *